United States Patent
de la Mora et al.

(10) Patent No.: US 6,768,119 B2
(45) Date of Patent: Jul. 27, 2004

(54) METHOD AND APPARATUS TO PRODUCE IONS AND NANODROPS FROM TAYLOR CONES AT REDUCED PRESSURE

(76) Inventors: Juan F. de la Mora, 80 Cold Spring St., New Haven, CT (US) 06511; Manuel Gamero-Castano, Busek Co. Inc. 11 Tech Cir., Natick, MA (US) 01760; Manuel Martinez-Sanchez, 7 Fair Oaks Dr., Lexington, MA (US) 02421

(*) Notice: Subject to any disclaimer, the term of this patent is extended or adjusted under 35 U.S.C. 154(b) by 469 days.

(21) Appl. No.: 09/826,341

(22) Filed: Apr. 4, 2001

(65) Prior Publication Data

US 2002/0109104 A1 Aug. 15, 2002

Related U.S. Application Data

(60) Provisional application No. 60/194,903, filed on Apr. 6, 2000.

(51) Int. Cl.[7] ............................................. H01J 27/00
(52) U.S. Cl. .................................. 250/423 R; 250/424
(58) Field of Search ............................. 250/423 R, 424, 250/425, 288

(56) References Cited

U.S. PATENT DOCUMENTS

| | | | | |
|---|---|---|---|---|
| 5,115,131 A | * | 5/1992 | Jorgenson et al. | 250/288 |
| 5,306,412 A | * | 4/1994 | Whitehouse et al. | 204/452 |
| 5,505,832 A | * | 4/1996 | Laukien et al. | 204/452 |
| 5,844,237 A | * | 12/1998 | Whitehouse et al. | 250/288 |
| 5,898,175 A | * | 4/1999 | Hirabayashi et al. | 250/288 |

OTHER PUBLICATIONS

Wilm et al., Electrospray and Taylor Cone theory, Dole's beam of macromolecules at last?, International Journal of Mass Spectrometry and Ion Processes 136 (194), pp. 167–180.*

* cited by examiner

Primary Examiner—Kiet T. Nguyen

(57) ABSTRACT

A new method and apparatus to produce drops with diameters several tens of nanometers and/or positive or negative ions with a wide range of chemical composition and masses as large as several kiloDalton is based on creating Taylor cone-jets of high electrical conductivity, moderate viscosity, and low volatility liquids under reduced pressure. The liquid is supplied at a controlled flow rate into a region at low pressure exposed to an electric field sufficient to electrically atomize it. Suitably charged, shaped and placed electrodes create the necessary electric field to form the Taylor cone and extract the charged particles it produces, with a desired energy and direction. Subsequent ion manipulation supplies beams of ions and/or nanoparticles for applications such as electrical propulsion or surface treatment. No liquids suitable to practice this invention have been known in the past and are introduced here as a key aspect of the invention. They are such as electrolytes of formamide (or organic liquids such as amides, alcohols, glycols, esters, ketones, organic phosphates or carbonates, etc., and mixtures of one or more of these components), ionic liquids (neat or mixed with other ionic liquids, molecular solvents and/or salts), molten salts and inorganic acids.

12 Claims, 1 Drawing Sheet

Figure 1A:
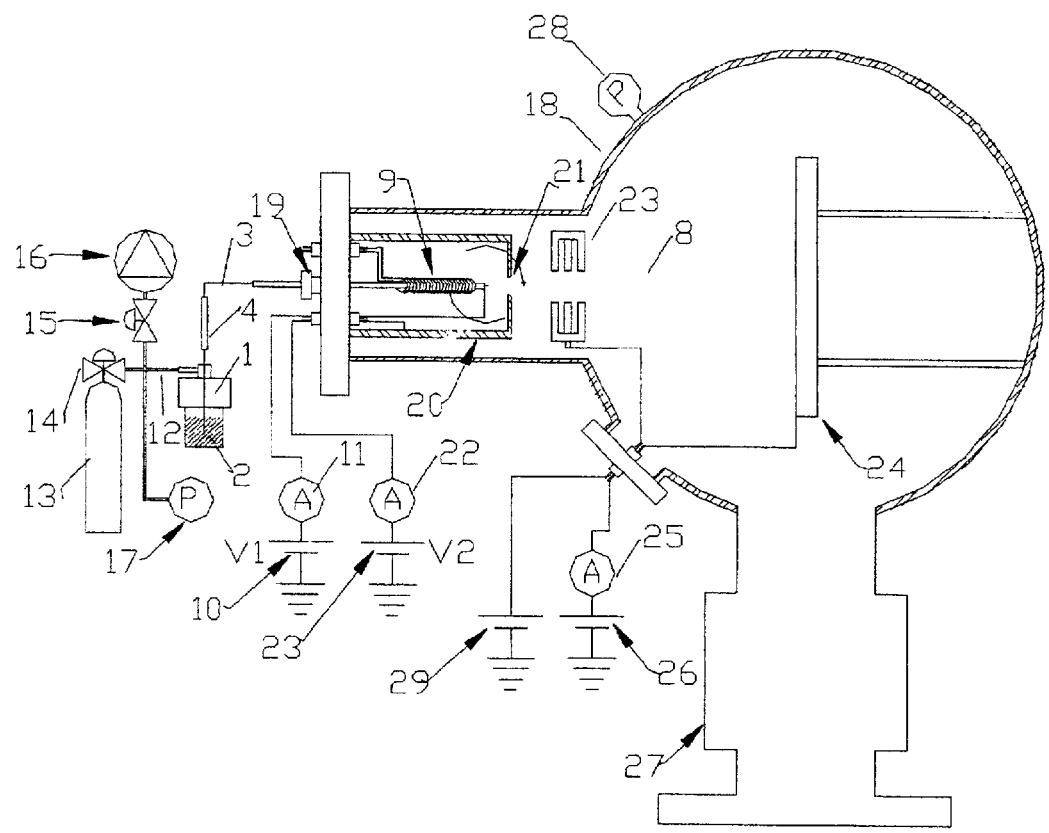

METHOD AND APPARATUS TO PRODUCE IONS AND NANODROPS FROM TAYLOR CONES AT REDUCED PRESSURE

This application claims priority from Provisional Patent Application No. 60/194,903 filed on Apr. 6, 2000, by inventors Manuel Gamero-Castao, Juan Fernandez de la Mora and Manuel Martinez-Sanchez, under the title "Method and apparatus to produce ions and nanodrops with controllable mass/charge from Taylor cones at reduced pressure".

The U.S. Government has rights in this invention as a result of its development with partial support from National Science Foundation Grant CTS-9319051.

FIELD OF THE INVENTION

This invention relates to the production of beams of ions for applications such as electrical propulsion or ion milling and writing, as well as to the production of beams of charged particles with nanometer sizes.

BACKGROUND OF THE INVENTION

Beams of charged particles in moderate or high vacuum are useful in many applications. Cluster beams of metals have been used for depositing thin films with special properties, exploiting the fact that the kinetic energy per cluster molecule may be controlled in the range below 1 eV. Closely related considerations have led to the use of beams of glycerol clusters for surface cleaning, such as in U.S. Pat. Nos. 5,796,111 and 6,033,484. Beams of charged colloids are useful also in electrical propulsion. Similarly, beams of atomic or molecular ions have been used in applications such as surface treatment (ion implantation), surface writing, etching or milling, high resolution lithography for microelectronic and other purposes. Also for sputtering and secondary ion mass spectrometry, and electrical propulsion among others. As discussed in U.S. Pat. No. 6,137,110, focused ion beams play a very useful role in the semiconductor industry by greatly reducing the time and costs associated to integrated circuit development and repair.

Ion beams may be generated in a variety of ways: by producing ions and extracting them from gas or plasma sources; from positively charged liquid metal surfaces by field evaporation from the tip of a Taylor cone; from solid surfaces, for instance by laser ablation ionization; etc. Charged beams of metal clusters have been produced by electron bombardment of neutral clusters formed by evaporation-condensation. Unfortunately, these methods are able to yield only relatively restricted classes of ionic species.

Gas sources may form ion beams only of gaseous or volatile substances.

Liquid metal ion sources (LMIS) have been described by P. D. Prewett and G. L. R. Mair in the book *Focused ion beams from LMIS* (Wiley, N.Y.; 1991). They are based on charging the surface of a molten metal held in a vacuum to a high voltage with respect to a neighboring extractor electrode. Within a suitable range of voltage differences, the meniscus of molten metal forms a so-called Taylor cone, whose sharp apex region emits predominantly metal ions. Such liquid metal ion sources (LMIS) have high brilliance and can be focused into submicron spots. But they can deliver only ions of metals and the few substances soluble in them, with exclusion of all negative ions. Liquid metal ion sources are generally operated in the low-current regime, where they emit predominantly individual metal ions. Although LMIS can also be run under conditions where larger ion clusters, nanometer drops and considerably larger drops are emitted together with neutral atoms and clusters, such regimes involve quite complex distributions of mass over charge ratios m/q, and are generally far less suitable than the pure ionic regime for most applications.

Laser sources involve high energy deposition on a surface. Although they may produce large and moderately charged clusters as well as small atomic and molecular species, they are unsuitable to generate beams of intact labile substances. Furthermore, in the regime where they would produce large clusters, they would have a wide distribution of charge over mass q/m and would be mixed with neutrals, being therefore unfit for applications such as electrical propulsion.

Existing ion beam sources are therefore limited to m/q values smaller than 200 Dalton, such as $Cs^+$ (133 Dalton) or $Au^+$ (197 Dalton) in liquid metal ion sources, or $Xe^+$ (131 Dalton) in plasma sources. They are also severely restricted in chemical composition, limiting the possibilities to combine chemical attack with purely physical erosion in applications such as etching. Hence, no chemically assisted focused ion beam analog exists to the etching processes commonly performed with the assistance of masks. Because chemical composition and mass/charge are key parameters determining the properties and breadth of applications of ion beams, there is a need to introduce new ion sources able to cover a much wider range of ionic chemical composition and m/q than previously available. To do so is one of the objectives of this invention.

Electrostatic atomization via Taylor cones of organic electrolytes (rather than liquid metals) has provided a related but different scheme to produce charged beams of small drops (rather than atomic ions) in a vacuum environment. In these systems, a liquid of low volatility and electrical conductivity K is supplied at a flow rate, Q ($cm^3/s$) to the tip of a capillary tube. A voltage difference $V=V_1-V_2$ is established between this tip and a neighbouring electrode, generally called the extractor. Within a suitable range of values of Q and V (where Q depends on K), the liquid meniscus takes the form of a cone, whose tip ejects a steady microjet, which in turn breaks into drops. This structure is often referred to as a cone-jet, following the classification discussed by M. Cloupeau in the Journal of Aerosol Science, Volume 25, pages 1143–1157, 1994. The spray of drops streaming from the end of the jet is generally referred to as an electrospray, and this terminology will be used here also. When the cone-jet forms in a vacuum environment, the charged drops produced are accelerated towards the extractor by the voltage difference V, and pass through an orifice in the extractor forming a relatively narrow beam. These beams of charged drops have proven useful in applications such as electrical propulsion and surface cleaning. This approach has been successful mainly with glycerol electrolytes, having high dielectric constant and a relatively small volatility. Furthermore, Taylor cones of glycerol held in vacuum in a multicone highly stressed regime under high voltage are capable also of producing ions of dissolved substances, and this feature has found applications in mass spectrometry, as explained by K. D. Cook in Mass Spectrometry Reviews, volume 5, pages 467–519, 1986. However, the electrospraying technique to produce beams of small drops and ions in vacuo has been limited by the relatively large size and associated large m/q of the drops, and by the relatively small concomitant ion currents. Also by the wide range of energies and solvation states in which the ions are produced in this highly stressed regime. In other words, Taylor cones of glycerol are ineffective as ion sources, with poor ion intensities, and wide energy and m/q distributions. As sources of drops, electrosprays of glycerol tend to produce drop diameters of several hundred nanometers, rather than the more desirable range of tens of nanometers. As a result, there is an inaccessible gap of many orders of magnitude in m/q space between values typical of ions (~100 Dalton), and those accessible with electrosprayed glycerol drops (~$10^6$ Dalton). This forbidden region includes the range of greatest practical interest for a number of applications, including electrical propulsion. Hence, a further object of this invention is to narrow down this m/q gap both on its upper and lower ends, by developing means to produce beams of much heavier ions as well as much smaller drops than previously possible.

It is known that the m/z ratio of electrospray drops can be decreased by reducing drop size, which in turn requires increasing the electrical conductivity K of the electrosprayed liquid. Furthermore, an article by J. J. Perel, et al. in the AIAA Journal, 7, 507–511 (1969) has revealed that Taylor cones of sulfuric acid with K values in excess of 10 S/m tend to yield dominantly ions rather than drops, in a regime presenting some analogies with the behaviour of liquid metal ion sources. Hence, those skilled in the art must have known for years that electrospraying solutions with electrical conductivities K larger than those available in glycerol electrolytes would have considerable advantages from the point of view of producing both ions and small microscopic drops. However, other than the corrosive and therefore inconvenient case of sulfuric acid (which is furthermore too conductive for nanodrop production), no solvent of low volatility has been known with the properties required to produce either considerably smaller drops than glycerol, or able to produce dominantly ionic emissions. It follows that attaining the objectives of this invention requires first identifying such suitable solvents, and this is a major objective of the present invention.

A key step in this invention is the recognition that traditional glycerol electrolytes do not have the desirable properties for the generation of high quality beams of either ions or nanodrops. The high viscosity of glycerol greatly hinders the mobility of ions dissolved in it, so that its room temperature electrical conductivity is below 0.02 S/m, even under the most favorable conditions of salt seeding. According to the scaling laws published by J. Rosell-Llompart and J. Fernández de la Mora, in J. Aerosol Sci., 25, 1093–1119, 1994, or by J. Fernández de la Mora, and I. G. Loscertales in J. Fluid Mechanics, 260, 155–184, 1994, this conductivity leads at best to jet diameters above 100 nm, whereby ion evaporation directly from the apex region of the Taylor cone-jet is essentially impossible. However, the high viscosity of glycerol leads to production of anomalously large drops upon jet breakup. In other words, whereby Taylor cone-jets of weakly viscous liquids such as water tend to break up into drops with a diameter approximately twice the jet diameter ($d_{drop}/d_{jet} \sim 2$), this diameter ratio increases with increasing liquid viscosity. This effect has been analyzed for the case of tetraethylene glycol in the above mentioned article by Rosell et al. (1994). Extrapolation of their data to the case of the considerably more viscous glycerol indicates that $d_{drop}/d_{jet}$ ratios up to some three times the inviscid ratio would arise. The electric field on the surface, of these drops scales as $q/d^2$. But the charge density $q/d^3$ has been shown by L. de Juan et al. (J. Colloid & Interface Science, 186, 280–293, 1997) to be fixed only by the current over flow rate through the cone-jet, which is not anomalous in glycerol. It follows that the surface field $E \sim (q/d^3)d$ is anomalously large for glycerol drops, possibly by a factor as large as three. Since this field scales as the ⅓ power of electrical conductivity, the conclusion is that glycerol drops have electric fields similar to those that would be expected in liquids some 27 times more conductive than glycerol itself (some 0.5 S/m). Such conditions are therefore sufficient to produce ion evaporation from electrosprayed glycerol drops, but by far insufficient to evaporate ions directly from the meniscus. This situation hence explains the weak ion currents observed from electrosprays of glycerol, as well as their wide spread in energy. Note further that the estimate just made on the anomalously large fields on the surface of glycerol drops would in reality be limited by the mechanism of Rayleigh explosions, whereby a drop with too large a charge explodes into smaller drops. But the final result would be qualitatively the same as just discussed, since the smaller daughter drops resulting from such explosions would in turn have surface electric fields even higher than their mother drops. This different scenario would again lead to anomalously large ion production from glycerol drops, but would still preclude ion formation directly from the Taylor cone.

In conclusion, in order to develop electrospray sources of ions and nanoparticles in vacuum one needs to identify liquids other than glycerol having suitable properties of high dielectric constant, high electrical conductivity (modest viscosity) and small vapor pressure. An article by M. Gamero-Castaño & J. Fernández de la Mora in the Journal of Chemical Physics, 113, 815, 832, 2000 provides much of the basis of the provisional patent application on which the following considerations are supported. This article shows that the organic solvent formamide is sufficiently involatile at room temperature to form Taylor cone-jets in vacuum. It further teaches that, in spite of the finite volatility of formamide, use of carefully sharpened capillaries with inner diameters as small as 20 $\mu$m enables forming electrosprays in vacuum even at the smallest flow rates at which the Taylor cones of formamide are stable at electrical conductivities above 1 S/m. It further shows first by analysis and then by experiment that electrical conductivities in excess of 1 S/m are necessary for ion evaporation to proceed at substantial rates directly from the meniscus of a Taylor cone (rather than indirectly from the drops). At smaller electrical conductivities, small rates of ion evaporation are produced, but they originate from the drops rather than from the meniscus. The distinction between ions originating from either the meniscus or the drops is important, because, given their secondary origin, ion currents from the drops cannot have the properties of brilliance (intensity) and narrow energy distribution necessary for a high quality ion beam. On the other hand, ions emitted directly from the meniscus originate from a virtually fixed voltage (narrower energy distribution), and are associated to currents that may be considerably larger (high brilliance) than either the total drop current or the secondary ion current from the drops. This distinction substantiates our prior conclusions on the limitations of glycerol, and confirms further the need for solvents exhibiting electrical conductivities in the range of 1 S/m to attain some of the objectives of the present invention.

The results just discussed based on formamide electrolytes are useful in applications requiring the production in a region at reduced pressures of nanometer drops, as well as of mixtures of drops and ions. The contributions of either the drop or the ionic component may dominate, depending on operating conditions. However, the regime of almost pure ionic emission typical of liquid metal ion sources has not yet been observed in formamide electrolytes. Hence, the production of drop-free ion beams from formamide electrolytes currently requires prior separation of the ions and the drops simultaneously present in the beam. This separation can be carried out with the help of magnetic fields. It can be performed also with purely electrostatic means because the drops are ejected in the direction of the axis, while the ions originating from the meniscus evaporate in the direction normal to the meniscus, which is between 90 and 60° off the axis. If the charged beam is focused on the axis by an electrostatic lens of sufficient geometric aberration, the ionic and drop components will focus at widely different positions and will hence be cleanly separated.

In addition to requiring separation of ions from drops, ion sources based on formamide electrolytes have so far been limited to ion currents generally smaller than 1 $\mu$A per Taylor cone, well below those attainable in liquid metal ion sources. Hence, still another goal of the present invention is to identify electrolytes such that their Taylor cones in vacuo would produce ion currents of many $\mu$A, with negligible or very small contributions of drops. We have already mentioned the experiments by Perel et al. with sulfuric acid. They showed directly that the sought almost pure ionic regime does indeed exist in liquids having electrical conductivities somewhere above 10 S/m. In spite of their new method to create negative as well as positive ions, we are not aware of a single subsequent study making use of acids as ion sources analogous to liquid metal sources. Evidently, the corrosive nature of sulfuric acid must have contributed to discourage further exploitation of this interesting source. We note also that sulfuric acid sources would not yield the wide range of m/q and chemical composition sought here, nor would other common acids of low volatility. It is therefore clear that other liquids having electrical conductivities well in excess of 2 S/m must be sought for this application. Moderately heated formamide electrolytes will evidently approach the pure ionic regime better than the room temperature formamide electrolytes already tested. Today's micromachining techniques can produce supporting electrodes for a heated Taylor cone of formamide with a base having a diameter smaller than 1 $\mu$m. The corresponding liquid emitters would have an exposed area some three orders of magnitude smaller than in earlier experiments with 20 $\mu$m bases. They would therefore have comparable or smaller evaporative losses at temperatures substantially above ambient, ant which K values in excess of 10 S/m may be expected. Microemitters of heated formamide are hence capable in principle of approaching and attaining the pure ionic regime. Other substances which are likely to reach this pure ion regime are molten salts. Although most salts melt at relatively high temperatures and many of them are reactive in the molten state, their volatility is often small at the melting point. They also offer a tremendous range of m/q ratios and chemical compositions. Of particular interest to attain the pure ion regime is a special class of salts which are liquid at or near room temperature and are commonly referred to as ionic liquids.

A More Detailed Description of some Liquids Suitable for the Practice of this Invention Among the main liquid properties required for the practice of this invention are the following:
  i) electrical conductivity in the range from 0.1 to several tens of S/m
  ii) vapor pressure below (preferably much below) 0.01 torr at operating temperature.
  iii) Viscosity coefficient in the range of 5 cP, preferably below. The larger the viscosity, the higher the tendency for the jet break-up process to form bigger and less monodisperse drops (Rosell et al., J. Aerosol Science 25, 1093–1119, 1994).

Several classes of liquids have been identified enjoying such properties to various degrees.

A. The first type includes organic solvents of high dielectric constant, low viscosity and low volatility. The preferred solvent is formamide, $HCONH_2$, which, among all known organic solvents of moderate viscosity, is singular both for its low volatility and its high dielectric constant ($\in$>100 at room temperature). As a result, formamide has an exceptional ability to dissolve salts, as illustrated in an article by E. Colton and R. E. Brooker appeared in 1958 in the Journal of the American Chemical Society, Vol. 80, pages 1595–1596. These authors report that many salts are soluble in formamide at 25° C. at levels in the range of 1 Kg/liter, and a few even above that level. For instance, at 25° C., $KF.2H_2O$ is soluble in formamide at 8.75 moles/liter. Most interesting for our purposes is the fact that, although formamide is a few times more viscous than water, many of its electrolytes have nonetheless room temperature electrical conductivities exceeding 2 S/m. Perhaps the main limitation of this solvent for the purposes of this invention is that its vapor pressure is substantially higher than that of glycerol. In the first published report of an attempt to produce Taylor cones of formamide in a vacuum, M. Gamero-Castaño et al. (J. Appl. Phys., 83 2428–2434, 1998) concluded that its volatility was excessive, and proceeded instead to use the considerably more viscous and less polar liquid tributyl phosphate. As a result, they could not reach the electrical conductivities required for this invention. Note further that their work with formamide was at the rather limited levels of vacuum afforded by a simple rotary pump (in the range of 0.1 torr). Also, they used unseeded formamide, with electrical conductivity levels much smaller than required for ion evaporation from the meniscus. Although they did not discuss how the finite volatility of formamide did interfere with the formation of a Taylor cone, the reasons are relatively clear. If the rate of solvent evaporation from the meniscus is comparable to the liquid flow rate Q pushed into the meniscus apex, the concentration of salt inside the remaining liquid increases comparably, leading possibly to salt precipitation. This problem is evidently much more serious in the case of concentrated solutions, since, for solid and involatile solutes, it can lead to clogging of the line supplying the liquid to the meniscus (this difficulty can, however, be avoided by use of volatile ammonium salts, or salts which are liquid at the operating temperature). Furthermore, the range of operating flow rates in Taylor cone-jets varies inversely with liquid conductivity, so that the relative component of liquid evaporating from the meniscus becomes considerably more serious as the conditions of high electrical conductivities required for the present invention are approached. In spite of the difficulties perceived in earlier work, formamide electrolytes can be electrosprayed in a vacuum, even at background pressures of $10^{-5}$ torr, and even at the high electrical conductivities and minuscule flow rates required to reach the ion evaporation regime. This possibility was first demonstrated by Gamero et al. in the article in J. Chem. Phys. (2000) forming the basis of the present invention. They did so by limiting the area of liquid exposed to the vacuum to relatively small values. They used commercially available silica capillaries with inner diameters of 20 $\mu$m, which they sharpened to a conical shape, such that the basis of the meniscus was itself nearly as small as 20 $\mu$m. They further made the silica capillaries conducting by chemical vapor deposition of tin oxide. Since the diameters of the jets of Taylor cones in the ion evaporation regime are typically in the range of 10 nm, supporting electrodes considerably smaller than 20 $\mu$m would be able to achieve comparable results, with even smaller interference from the finite volatility of formamide. As already mentioned, such microelectrodes could run in a vacuum with moderately heated formamide electrolytes at K values close to 10 S/m.

We have discussed the case of salt electrolytes dissolved in formamide. However, similar or even superior results can be achieved by use of a solution of an electrolyte in a solvent chosen from the class of compounds that comprises amides, alcohols, glycols, esters, ketones, organic carbonates and phosphates, etc., and mixtures of one or more of these components.

B. Ionic liquids. Ionic liquids are salts enjoying the remarkable property of being liquid at ambient or near-ambient conditions. Most ionic liquids have negligible volatility, not only at room temperature, but also at several hundred ° C. Ngo et al. (Thermoch. Acta, 357, 97–102, 2000) have investigated the temperatures at which a large number of ionic liquids begin to degrade thermally, which in many cases exceeds 400° C. Some ionic liquids exhibit room temperature electrical conductivities larger than 2 S/m, though with viscosity coefficients generally in excess of 10 cP. Although not ideal, these values may be sufficient to make such materials potentially superior to formamide solutions in certain applications. For instance, the mixtures of Aluminum Chloride and 1-methyl-3-ethylimidazolium chloride ($EMIm^+Cl^-$) have been studied extensively at varying molar factions $x_{Al}$ of $AlCl_3$. At room temperature, and $x_{Al}=0.44$, Q. Liao and C. Hussey (J. Chem. Eng. Data 41, 1126–1130, 1996) report K=2.186 S/m, $\mu=17.29$ cP. The corresponding values at $x_{Al}=0.44$ are K=1.1 S/m, $\mu=34.2$; and K=1.423 S/m, $\mu=13.79$ at $x_{Al}=0.667$. These ionic liquids have also been studied in mixtures with a few organic solvents such as benzene by Liao and Hussey (1996), and in benzene, acetonitrile and dichloromethane by R. L. Perry et al. (J. Chem. Eng. Data 40, 615–619, 1995). At $x_{Al}=0.51$, 40% mass fraction of benzene reduces the viscosity to 3.93 cP and increases K slightly above 3 S/m. At $x_{Al}=0.49$, 40% mass fraction of acetonitrile reduces $\mu$ well below 2 cP and yields K values above 6 S/m. Drastic reductions of viscosity and increases in electrical conductivity can therefore be obtained by mixing with organic solvents. Most interesting for our purposes is the fact these two advantages can be obtained even in moderately polar and non-polar solvents.

Of course, the mixtures just discussed are inappropriate for our purposes due to the high volatility of these solvents. However, mixtures of formamide with ionic liquids will evidently reduce their viscosity and increase their electrical conductivity. Although the vapor pressure of formamide in such mixtures will be lower than that of pure formamide, they will nonetheless be somewhat volatile. However, formamide-ionic liquid mixtures would have the advantage that no solid precipitates can form, so that there is no danger of clogging the emitter tip during the periods when the Taylor cone is not running. It is worth pointing out that the compatibility of ionic liquids with moderately polar solvents makes it possible to design mixtures of molecular solvents with ionic liquids with very small vapor pressure yet electrical conductivities above the value for the neat ionic liquid.

TABLE 1

Masses of anions and cations comprising several room temperature ionic liquids

| ion name | Abbreviation/formula | Mass (amu) | reference |
|---|---|---|---|
| 1-Ethyl-3-Methyl imidazolium | $EMIm^+$ | 111.2 | Wilkes et al. 1992 |
| 1-propyl-3-Methyl imidazolium | $PMIm^+$ | 125.2 | Ngo et at. 2000 |
| 1-butyl-3-Methyl imidazolium | $BMIm^+$ | 139.3 | a |
| 1-octyl-3-Methyl imidazolium | $OMIm^+$ | 195.3 | b |
| 1-dodecyl-3-Methyl imidazolium | $C_{12}H_{25}MIm^+$ | 251.4 | c |
| 1-tetradecyl-3-Methyl imidazolium | $C_{14}H_{29}MIm^+$ | 279.5 | c |
| 1-hexadecyl-3-Methyl imidazolium | $C_{16}H_{33}MIm^+$ | 307.5 | c |
| 1-octadecyl-3-Methyl imidazolium | $C_{18}H_{37}MIm^+$ | 335.6 | c |
| 1-$C_2H_4$-$C_6F_{13}$-3-Methyl imidazolium | $C_8H_4F_{13}MIm^+$ | 429.2 | d |
| 1-$C_2H_4$-$C_6F_{13}$-3-butyl imidazolium | $C_8H_4F_{13}BIm^+$ | 471.3 | d |
| 1-$C_2H_4$-$C_8F_{17}$-3-Methyl imidazolium | $C_{10}H_4F_{17}MIm^+$ | 529.2 | d |
| 1-$C_2H_4$-$C_8F_{17}$-3-butyl imidazolium | $C_{10}H_4F_{17}BIm^+$ | 571.3 | d |
| 1-$C_2H_4$-$C_8I_{17}$-3-butyl imidazolium | $C_{10}H_4I_{17}BIm^+$ | 2405.7 | hypothetical |
| Tetrafluoroborate | $BF_4^-$ | 86.8 | Wilkes et al. 1992 |
| Hexafluorophosphate | $PF_6^-$ | 145 | Fuller et al. |
| Trifluoromethylsulfonate | $CF_3SO_3^-$ | 149 | Bonhote et at. |
| Bis(trifluoromethylsulfonyl)imide | $(CF_3SO_2)_2N^-$ | 280.1 | Bonhote et al. |
| Bis(perfluorooctylsulfonyl)imide | $(C_2F_5SO_2)_2N^-$ | 380.15 | McEwen et at. |
| Tris(trifluoromethylsulfonyl)Metbide | $(CF_3SO_2)_3C^-$ | 411.2 | McEwen et at. |
| Tris(triiodomethylsulfonyl)Methide | $(CI_3SO_2)_3C^-$ | 1382.4 | hypothetical |
| Bis(periodoethylsulfonyl)imide | $(C_2I_5SO_2)_2N^-$ | 1459.2 | hypothetical |
| Carborane | $CB_{11}H_{12}^-$ | 143.2 | e |
| Hexachlorocarborane | $CB_{11}H_6Cl_6^-$ | 349.7 | e |
| Hexabromocarborane | $CB_{11}H_6Br_6^-$ | 616.4 | e |
| Hexaiodocarborane | $CB_{11}H_6I_6$ | 898.4 | hypothetical |
| Tetrachloroaureate | $AuCl_4^-$ | 338.8 | f |
| Tetrabromoaureate | $AuBr_4^-$ | 516.6 | hypothetical |
| Tetraiodoaureate | $AuI_4$ | 704.6 | hypothetical | a Suarez P. A. Z., Einjoft S., Dullius J. E. L., deSouza R. F., Dupont J. (1998) Journal de Chimie Physique et de Physico-chimie biologique, 95, 1626–1639; Suarez P. A. Z., S. Einloft, J. E. Dulius. R. F. Souza and J. Dupont (1996) Polyhedra 15, 1217
b Larsen A. S., Holbrey J. D., Tham F. S., Reed C. A. (2000) J. Am. Chem. Soc. 122, 7264
c Gordon C. M., Holbrey J. D., Kennedy A. R., Seddon K. R. (1998) J. Materials Chemistry, 8, 2627–2636
d Merrigan T. L., Bates E. D., Dorman S. C., Davis J. H. (2000) Chem. Commun. 2051–2052
e Larsen A. S., Holbrey J. D., Tham F. S., Reed C. A. (2000) J. Am. Chem. Soc. 122, 7264
f Hasan M., Kozhevnikov I. V., Siddiqui M. R. H., Steiner A., Winterton N. (1999) Inorganic Chemistry, 38, 5637–5641; Schreiter E. R., Stevens J. E., Ortwerth M. F., Freeman R. G. (1999) Inorganic Chem., 38, 3935

We have discussed the case of EMIm$^+$ based chloroaluminates. In spite of their interest, these molten salts have the problem of being air and water sensitive. Of similar or greater interest is the case of other ionic liquids also based on EMIm$^+$, though with non chloride anions which make them air and water compatible (Wilkes, J. S. and M. J. Zawarotko, J. Chem. Soc. Chem. Commun., 13, 965–967, 1992). Among others, one should mention EMIm$^+$ salts with either BF$_4^-$-(tetrafluoroborate), CF$_3$SO$_2^-$-(triflate-), (CF$_3$SO$_2$)$_2$N–(Im–) or PF$_6^-$-(hexafluorophosphate). Their room temperature electrical conductivities range from 0.85 S/m to 1.3 S/m, and their viscosity coefficients from 45 cP to 34 cP (J. Fuller, R. T. Carlin, R. A. Osteryoung, J. Electrochem. Soc. 144, 3881–3886, 1997; P. Bonhote et al., Inorg. Chem. 35, 1168–1178, 1996). Recently, R. Hagiwara et al. (J. Fluorine Chemistry, 99, 1–3, 1999) have investigated a compound based on HF and the ionic liquid 1-ethyl-3-methylimidazolium fluoride (EMIm$^+$F$^-$), which is liquid at room temperature, has low volatility, reaches K values of 12 S/m (25 C.), and, unlike HF, is not reactive with glass.

The miscibility of some of these and other air-compatible ionic liquids with several organic solvents have also been investigated by Bonhote et al. (1996). The group at Covalent (A. B. McEwen, S. F. McDevitt, V. K. Koch, J. Electrochem. Soc. 144, L84–L86, 1997; A. B. McEwen, H. L. Ngo, K. LeCompte, J. L. Goldman, J. Electrochem. Soc. 146, 1687–1995, 1999) has provided further information on the physical properties of some of these ionic liquids mixed with a diversity of solvents. Their 1999 paper reports K=6 S/m and $\mu$=1 cP for mixtures of EMIm-PF$_6$ with acetonitrile. No data are included for EMIm-BF$_4$, which has even more favorable properties as a pure liquid. Some of these air-compatible ionic liquids are miscible with formamide and with the less polar tributyl phosphate, as recently established by M. Gamero, M. and V. Hruby (AIAA paper 2000–3265, 36$^{th}$ AIAA/ASME/SAE/ASEE joint propulsion conference & exhibit, Jul. 16–19, 2000, Huntsville, Ala., 2000). McEwen et al. (1997) have studied mixtures of EMIm$^+$ salts with organic carbonates, some of which have moderately small volatilities. For instance, ethylene carbonate (EC) has a boiling point higher than formamide, though with a comparable extrapolated vapor pressure at 20° C. Interestingly, pure EC freezes at 36° C., but its 2 Molar solution with EMIm$^+$PF$_6^-$ and EMIm$^+$Im$^-$ are liquid at room temperature. This suggests the possibility of using mixtures of ionic liquids with other high boiling point solvents which, when pure, are solid at room temperature. The maximum room temperature conductivity reported by McEwen et al. (1997, 1999) for mixtures of EMIm$^+$PF$_6^-$ or EMIm$^+$Im$^-$ with organic carbonates is 2.7 S/m (2.2 S/m for EC).

Another effective means to improve the properties of pure ionic liquids in relation to this invention is to elevate their temperature. Several of the references cited show that this increases their electrical conductivity and decreases their viscosity quite substantially, while generally keeping their volatility unmeasurably small. We are not aware of data on electrical conductivities at temperatures approaching decomposition conditions (300–400° C.). But the measurements of McEwen et al. with EMIm$^+$BF$_4^-$ show K~8 S/m at 100° C., and extrapolate to values in excess of 30 S/m at 200° C. Similar extrapolations can be based on the data published by Bonhote et al.

In conclusion, moderately heated ionic liquids are among the most promising materials known able to match the characteristics of acids for ionic propulsion in the pure ion regime. Their considerable advantages over acids lie not only in their chemical stability, but also, and principally, in the enormous variety of possible ionic liquids, and therefore the high likelihood to find suitable candidates with molecular weights in the kiloDalton range. The added complexity associated to the required temperature control would be compensated in applications such as electrical propulsion by an ability to run a given ionic liquid as either mainly a drop emitter (at or below room temperature), or mainly an ion emitter (at elevated temperatures).

One important goal of this invention is to greatly increase the range of ionic chemical compositions and m/q ratios that can be produced with respect to those available from alternative ion sources. The vastly wider range of chemical compositions offered by the present invention is evident from the enormous variety of anions and cations in either formamide-soluble salts, or in existing or potentially synthesizable ionic liquids. We have mentioned the high solubility of KF.2H$_2$O in formamide. The corresponding electrolytes will therefore easily attain electrical conductivities at which $\mu$A currents of F$^-$ ions would be evaporated directly from the Taylor cone, thereby yielding a bright ion source where physical and chemical attack of surfaces could be used simultaneously for directional or conformal etching. Similarly, a variety of salts composed of very heavy anions and cations exist which would allow production of beams of rather heavy ions. For instance, dodecatungstates with molecular weights as large as 3000 amu exist, some of which are highly soluble in formamide. Although these anions are polyvalent and their m/q would be closer to 1000 than to 3000 Dalton, emission in the positive mode of sodium dodecatungstate electrolytes would yield dominantly a singly charged salt molecule attached to a sodium ion. The reason is that the energy barrier for ion evaporation is considerably larger for Na$^+$ than for this bulkier complex.

Another goal of the present invention is not only to produce beams of ions in a wide range of masses and compositions, but also to do so as close as possible to the pure ion evaporation regime of Taylor cones. Although this goal might be reached from high temperature molten salts or from moderately heated microsources of formamide electrolytes, we wish to argue here that heated ionic liquids are ideal sources not only for moderately small ions such as EMIm$^+$, but also for many other ions, some with kiloDalton masses. Table 1 lists the masses of the cations and anions comprising some of the ionic liquids for which published data are available. The most common anion and cation are BF$_4^-$ and EMIm$^+$, with masses (87 and 111 amu) comparable to those of alternative ion propulsion materials (Cs and Xe). The heaviest anion in common use is (CF$_3$SO$_2$)$_3$C$^-$(m= 411.2 amu). In spite of its relatively large mass, it has fairly favorable viscosity and melting point (–34° C. when paired with EMIm$^+$). This is by no means an upper limit for attainable anionic mass, as indicated by more exotic examples collected in the Table, for which only one or a few articles have been published to date. Noteworthy examples are those based on tetrachloroaureate Cl$_4$Au$^-$. The Br$_4$Au$^-$ and I$_4$Au$^-$ ions have masses of 516.6 and 704.6, are common in inorganic salts (i.e. KI$_4$Au), and have been included in the Table as hypothetical because corresponding dialkylimidazolium salts have not yet been synthesized, and their chemical stability and liquidus range are still unknown. The heaviest (non-hypothetical) anion included in the Table, CB$_{11}$H$_6$Br$_6^-$ (616.4 amu), is based on the carborane ion CB$_{11}$H$_{12}^-$. A most interesting feature of the related study of Larsen et al. (e in Table 1) is the slight effect of hallogenation on melting temperature (T$_m$=122° C. for EMImCB$_{11}$H$_{12}$, and 114° C. and 139° C. for the hexachlorinated and hexabrominated counterparts). Similarly, Hasan et al. (f in the Table) report almost the same melting point (T$_m$=58° C.) for EMImCl$_4$Au than for EMImPF$_6$. If this trend is general, and substitution of the widely used fluorinated anions (CF$_3$SO$_2$)$_2$N$^-$, (C$_2$F$_5$SO$_2$)$_2$N$^-$ and (CF$_3$SO$_2$)$_3$C$^-$ by their brominated or iodinated counterparts leads to stable ionic liquids with comparable melting points, one would then reach molecular masses as high as 1459.2 in (C$_2$I$_5$SO$_2$)$_2$N$^-$ (included in the Table also as hypothetical). Notice that this relatively compact anion would be well over an order of magnitude heavier than $Cs^+$ or $Xe^+$. The possibility to add larger and therefore substantially heavier appendages in the anion or cation remains open. Its consequences on dialkyl-imidazolium-based salt properties have already been explored to a limited extent by Gordon et al. (c in the Table) with a single long alkyl chain (up to $C_{18}H_{37}$), and Merrigan et al. (d in the Table) by appendage of long fluorinated tails (up to $C_8F_{17}$) to the ethylene group in $-EMIm^+$ or $-EBIm^+$. Gordon et al. have emphasized the liquid crystalline structure of their salts, also enjoyed by the fluorous salts. Merrigan et al. discuss the strong surfactant properties introduced by their fluorotails. Most interesting is the fact that the long hydrocarbon chain does not increase substantially the melting point, and, in some cases, actually decreases it. For instance, the melting point of $C_nH_{2n+1}MImPF_6$ goes from 63° C. at n=2, down to 40° C. at n=3, to recover the value of $EMImPF_6$ (n=2) only beyond n=12 ($T_m$=60, 74, 74 and 80° C. for n=12, 14, 16 and 18, respectively). Similarly, $C_mF_{2m+1}C_2H_2MImPF_6$ have melting points at 61 and 87° C. for m=6 and 8, respectively. Since these melting temperatures are relatively close to that of the small $EMImPF_6$, it appears that they are to a large measure fixed by the anion $PF_6^-$. Hence, the same long tailed cations paired with $BF_4^-$ should melt at considerably lower temperatures (11° C. for $EMImBF_4$ versus 62° C. for $EMImPF_6$). It is important to note also that almost all these salts remain in the liquid state for very long times considerably below the melting point. Hence, the actual freezing temperatures of $C_nH_{2n+1}MImPF_6$ are +5, −81 (Ngo et al.) and −61° C. for n=2, 3 and 4 (a in the Table), respectively. This means that sources of ions or drops can be run at room temperature by simply heating up the liquids initially to a molten state, and then letting them cool back to room temperature.

Another important consideration could be that the viscosity coefficient $\mu$ of ionic liquids with long tails might be larger than in their tailless counterparts. Viscosity is known to decrease q/m in the pure drop regime by increasing drop size. But its role in the pure ion regime could be favorable, by decreasing the emission of drops. This point will have to be investigated experimentally, as there is no experience in electrospraying such substances. An increased viscosity coefficient would also have the indirect consequence of decreasing the electrical conductivity of the liquid making it harder to reach the pure ion evaporation regime. Neither Gordon et al. nor Merrigan et al. give quantitative information on either K or $\mu$ for their long tailed species. But the comparable work of Ito et al. (Electrochimica Acta, 45, 1295–1298, 2000) with $C_nH_{2n}$ chains joining together two $MIm^+$ groups in $EIm^+-C_nH_{2n}-EIm^+ + 2(CF_3SO_2)_2N^-$ shows a negligible effect of the chain length on electrical conductivity K, from n=2 up to 8. This holds as long as the salt remains in the molten state (however, $T_m$ does depend on n).

In conclusion, anion and cation mass can be greatly increased in many ionic liquids by appendage of longer tails, hallogenation, addition of heavy metals, etc., without serious property deterioration. Considering the excellent ionic liquid properties and large masses already attained without a concerted synthetic effort to actually maximize molecular weight, and considering further the enormous variety of potential ionic liquids and the rapid pace at which many of them are being synthesized and studied, it is evident that many more ionic liquids with rather large masses and electrical conductivities exceeding 10 S/m will become available in the future. In conjunction with such materials, the present invention constitutes the only available high quality source of heavy ions, and has the additional advantage that it can run close to the pure ion emission regime.

BRIEF SUMMARY OF THE INVENTION

A source of ions and/or drops comprising a reservoir containing a liquid with electrical conductivity K between 0.1 S/m and 100 S/m; means to convey this liquid at a controlled flow rate Q into a supporting electrode in a vacuum environment, where it forms a meniscus; means to create an electric field between the meniscus and a surrounding extractor electrode, such that a Taylor cone-jet forms and produces a beam of ions and/or drops which passes through an opening suitably placed in the extractor electrode; means to control the temperature of the liquid meniscus; means to manipulate the beam of charged particles produced prior to its use in applications such as electrical propulsion, surface treatment, etc. This beam manipulation may include electromagnetic separation of its components, collimation, focusing, further acceleration or deceleration, combination with another beam of opposite polarity for partial or complete neutralization, etc. Suitable liquids are electrolytes of formamide or its mixtures with other non-volatile solvents such as amides, alcohols, glycols, esters, ketones, organic carbonates and phosphates and mixtures of one or more of these components. Also mixtures of these solvents with ionic liquids. Other suitable liquids are inorganic acids, molten salts, ionic liquids, and electrolytes of salts dissolved in these liquids and their mixtures. Preferred liquids for the production of ion beams are moderately heated ionic liquids whose melting points are near room temperature. Preferred liquids for the production of beams of heavy anions or cations are moderately heated ionic liquids composed of heavy anions or cations, paired with lighter cations or anions.

BRIEF DESCRIPTION OF THE DRAWINGS AND TABLES

Figure 1B:
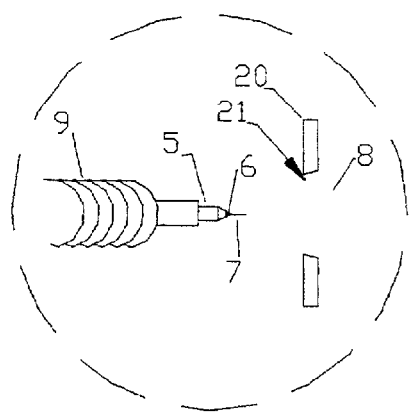

FIGS. 1A and 1B depict a schematic of an apparatus which incorporates the invention.

TABLE 1. collects the masses of several anions and cations comprising room temperature ionic liquids suitable to practice the invention, many of them having substantial masses.

DETAILED DESCRIPTION OF THE INVENTION

A better understanding of the invention may be obtained with reference to its embodiment shown in FIG. 1. 1 is an air tight reservoir chemically inert with respect to the working fluid 2 held within it. This liquid may be, for instance, an electrolyte of formamide, or its mixtures with other organic or ionic liquids, an ionic liquid, etc. 3 is a liquid transfer line communicating the liquid 2 in reservoir 1 with the emitter electrode 5 supporting the liquid meniscus 6, both shown in the expanded view of FIG. 1B. The transfer line 3 shown is a capillary tube of fused silica with an inner diameter of 20 $\mu$m and an outer diameter of 360 $\mu$m. This line may be divided into two portions to accommodate a bubble-type flow meter 4 in between, which serves the purpose of monitoring the flow rate Q of liquid fed to the tip of the transfer line. The end of transfer line 3 constitutes in the present case the emitter electrode 5. It is sharpened into a cone that ends at a diameter of 20 $\mu$m coinciding approximately with the ID of the capillary tube 3, and is represented in FIG. 1B as the wider and clear portion of the cone. The liquid meniscus 6, barely discernible at the scale of FIG. 1B, is represented as the dark cone continuing the clear cone 5. The basis of the liquid meniscus is therefore of 20 $\mu$m in this case. 9 includes means for controlling the temperature of the meniscus 6. In other cases, it may be preferable to build parts 1, 3, 4, 5 and 9 within a miniaturized single block. 7 is the fine jet emerging from the apex of the Taylor cone 6, which in turn leads to the spray 8 of ions and/or drops. The emitter electrode 5 is made conducting in this case by deposition of a thin film of semiconducting oxide or metal on the silica capillary. It is maintained at electrical potential $V_1$ by electrical contact with power supply 10, through an electrometer 11 which monitors the electrospray current. In another embodiment of the invention 10 may be put in electrical contact with the meniscus through the solution by means of an electrode introduced into the liquid 2 in reservoir 1. In the particular configuration of FIG. 1 the flow rate Q of liquid into the meniscus 6 is controlled by introducing gas in the reservoir through line 12 from the compressed gas source 13 through valve 14, or by withdrawing it into a vacuum source 16 through valve 15. The pressure of gas in reservoir 1 is monitored through differential gauge 17. The liquid meniscus 6 emerges into the interior of vacuum chamber 18. The capillary tube 3 enters into the vacuum chamber 18 through connector 19, which ensures a leak free coupling. The emitter electrode 5 holding the liquid meniscus 6 is surrounded by the extractor electrode 20, in turn connected to a second power supply 23 which keeps it at a fixed voltage $V_2$. 22 is a second electrometer. The voltage difference $V_1-V_2$ is controlled such that a Taylor cone jet forms on the meniscus 6. The jet 7 or the spray 8 issuing from it leaves the region between emitter and extractor through opening 21. This beam goes then through the beam manipulation system 23, where its various components may be separated, focused, partly neutralized, steered, collimated, etc. In another embodiment of the invention the extractor electrode may be microfabricated together with the emitter electrode and reservoir system, and the liquid flow rate may be controlled at fixed reservoir backpressure by means of the voltage difference $V_2-V_1$ between extractor and emitter. The flow control system may include a feedback loop aimed at setting the spray current at a fixed value. For applications such as ion propulsion not requiring a sharply focused beam, the ion source may consist of many rather than just one emitter, each with its own current control system. 24 is a target where the beam is collected. It is kept at potential $V_3$ by power supply 26. This target may be simply a phosphor screen or a target surface across which the beam is steered for writing or etching purposes. It may be a flange where the present source is connected to another vacuum system for purposes such as sputtering or cleaning. It may be a complex system including a surrounding grid to avoid secondary ion escape from the target. It may be connected to an oscilloscope 25*a* to monitor the beam current when the cone-jet is impulsively suppressed (with electronic means included for simplicity as part of power supplies 10 or 23), or to an electrometer 25*b* to monitor the collected current or its dependence on $V_1-V_3$. In applications such as electrical propulsion, 24 may simply be an opening letting the beam escape into the vacuum environment; etc. Under terrestrial conditions chamber 18 may need to be evacuated via pump 27, and its pressure monitored through gauge 28. Pump 27 may be unnecessary in sealed systems where the working liquid 2 has a partial pressure smaller than the desired operating pressure in the chamber. Such would be the case when, for instance, one or many ion sources are used to create an image on a monitor, or as an amplifier where small voltage variations result in large current variations, or in similar other devices.

It should be understood that the foregoing description is only illustrative of the invention. Although FIG. 1B represents a liquid meniscus with only one Taylor cone, multiple Taylor cones supported on a single emitter electrode are also included in the invention. Although FIG. 1 shows only a single source of charged particles, many such sources can be combined to produce more intense beams. The term liquid reservoir (illustrated with 1 in FIG. 1) should be understood in the broad sense, since the full liquid sample could be placed initially on the emitter electrode without the need for either the external container 1 or the liquid transfer line 3. Such an arrangement is widely used in liquid metal ion sources, and is suitable also for the present invention in cases when the liquid is highly involatile, such as for ionic liquids operating at small flow rates.

We claim:

1. A method of producing a stream of charged particles in a low pressure environment that comprises the following essential steps:

(a) supplying a flow of a non-corrosive and non-metallic liquid, said liquid having a vapor pressure below 0.1 torr at 20° C., a viscosity coefficient below 2 g/cm/s at 20° C., and an electrical conductivity greater than 0.04 S/m at 20° C. to a region maintained at a pressure below 100 millitorr in which there is an electric field sufficiently intense to disperse said liquid into said low pressure region as a stream of small charged particles; and (b) providing one or more electrodes having configurations, potentials and positions such that all or a selected part of said stream of small charged particles will flow in a desired direction at a desired velocity; wherein said small charged particles comprise charged drops, molecular ions, cluster ions, or mixtures of the foregoing.

2. A method as in claim 1 in which the volatility of said liquid is low enough so that said liquid does not boil or freeze when it enters said low pressure region.

3. A method as in claim 1 in which said liquid has an electrical conductivity between 0.1 and 100 S/m.

4. A method as in claim 1 in which the properties of said liquid, the flow rate at which said liquid is supplied into said low pressure region and the intensity of said electric field are such that said liquid takes the shape of a Taylor cone-jet.

5. A method as in claim 1 in which said liquid comprises a solution of an electrolyte in a solvent, and wherein said solvent is selected from the group consisting of amides, alcohols, glycols, esters, ketones, organic carbonates, organic phosphates, and mixtures of one or more of the foregoing.

6. A method as in claim 1 in which said liquid is selected from the group consisting of ionic liquids and molten salts.

7. An apparatus for producing a stream of charged particles in a low pressure environment, wherein said apparatus comprises the following essential elements:

(a) a reservoir or a source of a non-corrosive and non-metallic liquid, said liquid having a vapor pressure below 0.1 torr at 20° C., a viscosity coefficient below 2 g/cm/s at 20° C., and an electrical conductivity greater than 0.04 S/in at 20° C, (b) a region maintained at a low pressure, wherein said low pressure is below 100 millitorr, and wherein said region is exposed to an electric field, (c) a means for supplying a flow of said liquid from said reservoir or said source into said region containing said electric field at a controlled flow rate such that the field disperses the liquid arriving in said region into a stream of charged particles, (d) one or more electrodes positioned at appropriate locations and appropriate potentials to produce said electric field in said region and to steer the stream of charged particles produced in said region exposed to said electric field so that said stream of charged particles flows in a desired direction at a desired velocity away from said region with said electric field, (e) power supplies to provide the voltages and currents necessary to maintain said electrodes at said potentials such that said electric field will disperse electrostatically said liquid into said stream of charged particles;

wherein said charged particles comprise charged drops, molecular ions, cluster ions, or mixtures of the foregoing.

8. An apparatus as in claim 7, wherein said apparatus incorporates a vacuum pump to create and maintain said region at reduced pressure.

9. An apparatus as in claim 7, wherein said apparatus comprises a means to control the temperature of said liquid in said region containing said electric field.

10. An apparatus as in claim 9, wherein said apparatus produces primarily ions, wherein said liquid at said controlled temperature has an electrical conductivity in excess of 1 S/m, and the largest dimension of the liquid exposed to the low pressure region is smaller than 20 micrometers.

11. An apparatus as in claim 9, wherein said apparatus produces primarily ions, and wherein said liquid at said controlled temperature is an ionic liquid, or a mixture including an ionic liquid, and said liquid has an electrical conductivity in excess of 1 S/m.

12. An apparatus as in claim 11, wherein said apparatus produces primarily heavy ions, wherein either the anions or the cations composing said ionic liquid have mass/charge ratios in excess of 300 Dalton.

* * * * *